United States Patent
Igarashi et al.

(10) Patent No.: US 10,351,946 B2
(45) Date of Patent: Jul. 16, 2019

(54) SPUTTERING TARGET AND METHOD FOR PRODUCING SAME

(71) Applicant: MITSUBISHI MATERIALS CORPORATION, Tokyo (JP)

(72) Inventors: Kazunori Igarashi, Naka (JP); Muneaki Watanabe, Naka (JP); Yuuki Yoshida, Naka (JP); Kouichi Ishiyama, Naka (JP); Satoru Mori, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 428 days.

(21) Appl. No.: 15/027,436

(22) PCT Filed: Oct. 7, 2013

(86) PCT No.: PCT/JP2013/077874
§ 371 (c)(1),
(2) Date: Apr. 6, 2016

(87) PCT Pub. No.: WO2015/052848
PCT Pub. Date: Apr. 16, 2015

(65) Prior Publication Data
US 2016/0237551 A1    Aug. 18, 2016

(51) Int. Cl.
*C23C 14/34* (2006.01)
*H01J 37/34* (2006.01)
(Continued)

(52) U.S. Cl.
CPC ........ *C23C 14/3414* (2013.01); *B22F 1/0003* (2013.01); *B22F 3/1007* (2013.01);
(Continued)

(58) Field of Classification Search
CPC ............................ C23C 14/14; H01J 37/3426
See application file for complete search history.

(56) References Cited

U.S. PATENT DOCUMENTS

| 9,660,127 B2 | 5/2017 | Zhang et al. |
| 2012/0045360 A1* | 2/2012 | Matsumura ........... C22C 1/0425 420/591 |

FOREIGN PATENT DOCUMENTS

| JP | 10-135495 A | 5/1998 |
| JP | 2008-138232 A | 6/2008 |

(Continued)

OTHER PUBLICATIONS

Office Action dated May 4, 2017, issued for the corresponding Chinese patent application 201380078980.0 and English translation thereof.

(Continued)

*Primary Examiner* — Jason Berman
(74) *Attorney, Agent, or Firm* — Locke Lord LLP

(57) ABSTRACT

Provided are a sputtering target composed of a Cu—Ga sintered compact that has a further reduced oxygen content and can suppress abnormal discharges, and a method for producing the same. The sintered compact has a component composition containing a Ga content of 20 at % or higher and less than 30 at % with the balance being Cu and inevitable impurities, and has an oxygen content of 100 ppm or lower and an average grain size of 100 μm or less, and exhibits the diffraction peaks assigned to the γ and ζ phases of CuGa as observed in X-ray diffraction, wherein the main peak intensity of the diffraction peaks assigned to the ζ phase is 10% or higher relative to that of the diffraction peaks assigned to the γ phase.

2 Claims, 5 Drawing Sheets

(51) Int. Cl.
  *C22C 9/00* (2006.01)
  *B22F 3/10* (2006.01)
  *C22C 1/04* (2006.01)
  *B22F 1/00* (2006.01)
  *C23C 14/14* (2006.01)

(52) U.S. Cl.
  CPC .............. *C22C 1/0425* (2013.01); *C22C 9/00* (2013.01); *C23C 14/14* (2013.01); *H01J 37/3426* (2013.01); *H01J 37/3429* (2013.01); *B22F 2201/01* (2013.01); *B22F 2301/10* (2013.01); *B22F 2999/00* (2013.01)

(56) References Cited

FOREIGN PATENT DOCUMENTS

| JP | 2010-265544 A | 11/2010 | | |
|---|---|---|---|---|
| JP | 2012-031508 A | 2/2012 | | |
| JP | 2012-211382 A | 11/2012 | | |
| JP | 2012-214857 A | 11/2012 | | |
| JP | 2012-246574 A | 12/2012 | | |
| JP | 2013-142175 A | 7/2013 | | |
| TW | 201307595 A | 2/2013 | | |
| TW | 201319287 A | 5/2013 | | |
| WO | WO-2011/010529 A1 | 1/2011 | | |
| WO | WO-2011010529 A1 * | 1/2011 | ................ | B22F 3/14 |

OTHER PUBLICATIONS

Supplementary European Search Report dated Apr. 18, 2017, issued for European patent application No. 13895300.5.
Office Action dated Oct. 11, 2016, issued for the Taiwanese patent application No. 102136527 and English translation thereof.
Notice of Reasons for Rejection dated Dec. 15, 2015, issued for the Japanese patent application No. 2012-162291 and English translation thereof.
International Search Report dated Dec. 17, 2013, issued for PCT/JP2013/077874.

* cited by examiner

[FIG. 1]
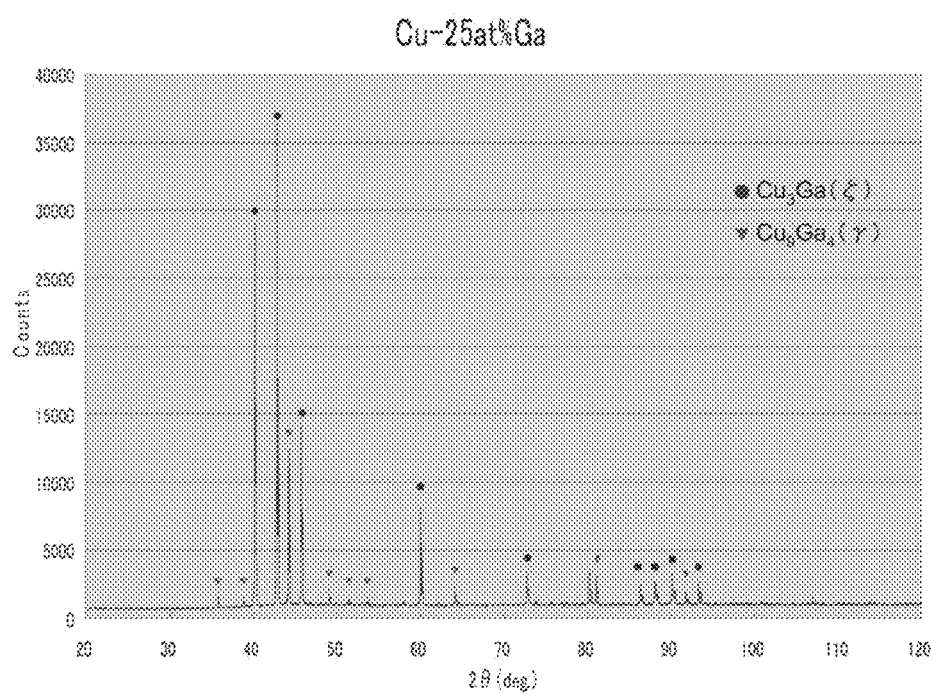

[FIG. 2]
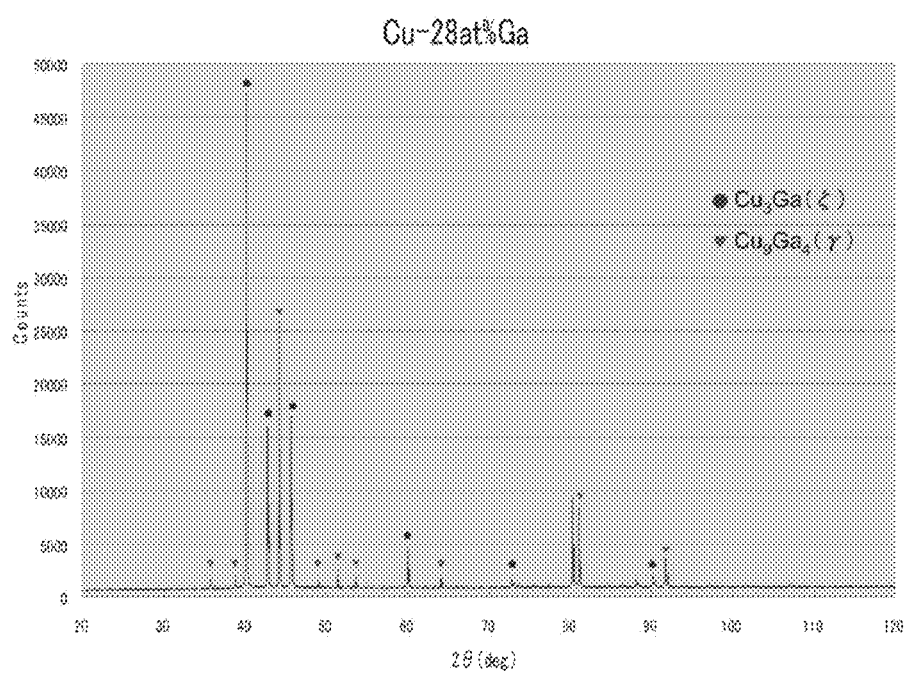

[FIG. 3]
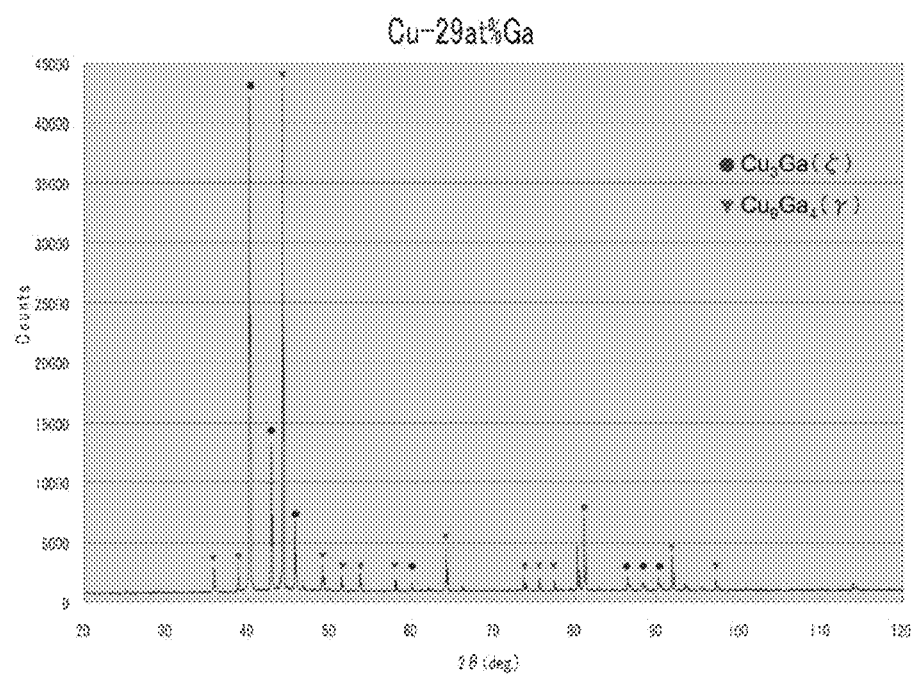
[FIG. 4]
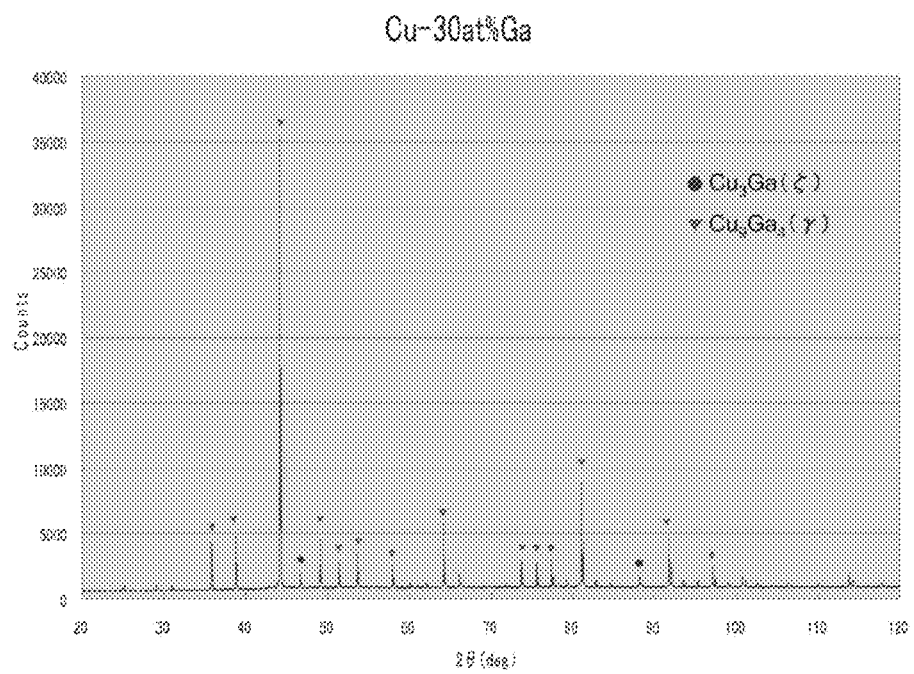

[FIG. 5]
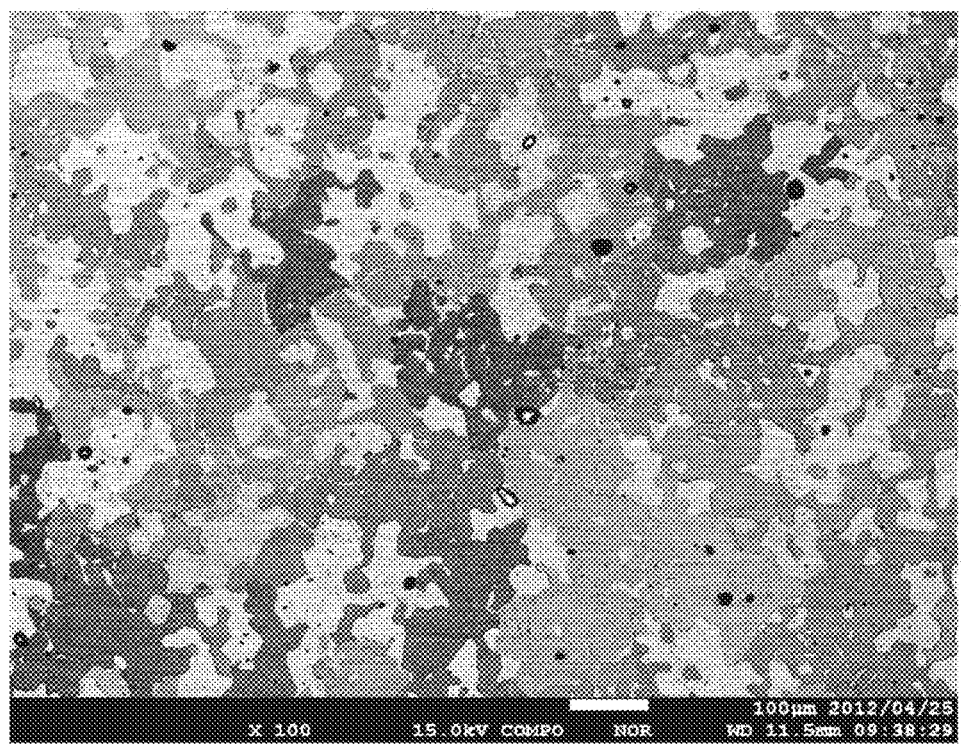

[FIG. 6]
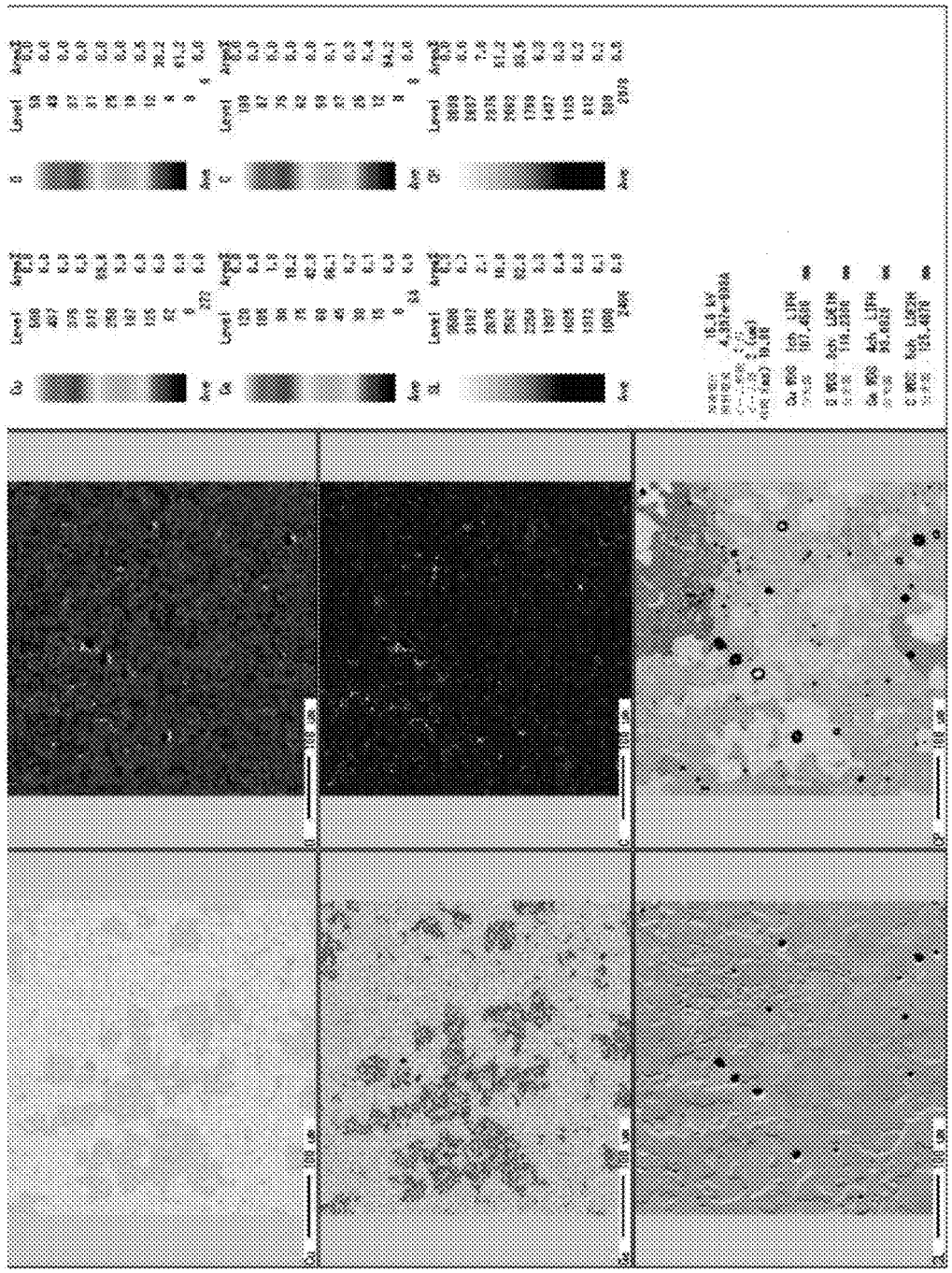

SPUTTERING TARGET AND METHOD FOR PRODUCING SAME

BACKGROUND OF THE INVENTION

Field of the Invention

The present invention relates to a sputtering target for use in producing a Cu—In—Ga—Se compound film (hereinafter may be abbreviated to "CIGS film") for forming the light-absorbing layer of a GIGS thin-film solar cell, and a method for producing the same.

Description of the Related Art

In recent years, thin-film solar cells, including chalcopyrite-based compound semiconductors, have come into practical use. The thin-film solar cells including the compound semiconductors have a basic structure in which an Mo electrode layer (positive electrode) is formed on a soda-lime glass substrate, a light-absorbing layer made of a GIGS film is formed on the Mo electrode layer, a buffer layer of ZnS, CdS, or the like is formed on the light-absorbing layer, and a transparent electrode layer (negative electrode) is formed on the buffer layer.

As a method for forming light-absorbing layers as described above, a multi-source deposition method, for example, is known. This method can produce light-absorbing layers having a high energy conversion efficiency. However, its vapor deposition from a point source tends to reduce the uniformity of film thickness distribution when the deposition is performed on a large-area substrate. Thus, a sputtering method has been proposed for forming light absorbing layers.

In the sputtering method (what is called "selenization method") for forming light-absorbing layers as described above, first an In film is deposited by sputtering using an In target, and then a Cu—Ga binary alloy film is deposited or this In film by sputtering using a Cu—Ga binary alloy target; and the resultant laminated precursor film consisting of the In film and the Cu—Ga binary alloy film is subject to a heat treatment in a Se atmosphere to produce a CIGS film.

Another method based on the above technique is also disclosed, in which said laminated precursor film, consisting of the Cu—Ga alloy film and the In film, is formed by depositing a Cu—Ga alloy layer with a high Ga content, a Cu—Ga alloy layer with a low Ga content, and an In layer in this order from a metal back electrode layer side by a sputtering method, and this film is subject to a heat treatment in a selenium and/or sulfur atmosphere so as to attain a Ga concentration gradient, which gradually (stepwise) changes from the interface layer (buffer layer) toward the metal back electrode layer, in the thin film light-absorbing layer. With this technique, the thin-film solar cell with a high open circuit voltage can be achieved, and peeling-off of the thin film light-absorbing layer from the other layer can be prevented. In this case, the Ga content in the CuGa target is 1 to 40 at % (see Patent document 1).

in order to form such a Cu—Ga alloy layer, Patent document 2 discloses use of a Cu—Ga alloy sintered compact sputtering target as a CuGa target that is produced by sintering a Cu—Ga mixed powder, which is prepared by a water atomization apparatus, by hot pressing, for example. This Cu—Ga alloy sintered compact sputtering target has a single composition, except the main peak (γ phase ($Cu_9Ga_4$ phase)), exhibits a peak intensity of 5% or less relative to the main peak in X-ray diffraction of the Cu—Ga alloy, and has an average crystal grain size of 5 to 30 μm. This target also has an oxygen content of 350 to 00 ppm.

[PRIOR ART DOCUMENTS]

[PATENT DOCUMENTS]

[Patent Document 1] Japanese Patent Laid-Open No. 10-135495
[Patent Document 2] WO2011/010529

SUMMARY OF THE INVENTION

[Problems to be Solved by the Invention]

The following problems still remain in the conventional techniques described above.

Specifically, although the target produced by hot pressing in the method of Patent document 2 has a low oxygen content and can suppress abnormal discharges, solar cell manufacturers still demand a target width a lower oxygen content. Furthermore, a significantly reduced oxygen content of 40 to 50 ppm in a target produced by a melting method can be achieved as shown by Table 1 in Patent document 2, but disadvantageously its average grain size is significantly increased to 830 to 1100 μm, which in turn increases abnormal discharges.

The present invention has been made in view of the aforementioned circumstances, and an object of the present invention is to provide a Cu—Ga sintered compact sputtering target that has a further reduced oxygen content and can suppress abnormal discharges, and a method for producing the same.

[Means for Solving the Problems]

The present invention adopts the following configuration in order to overcome the aforementioned problems. Specifically, a sputtering target according to a first aspect of the present invention is composed of a sintered compact that has: a component composition containing a Ga content of 20 at % or higher and less than 30 at % with the balance being Cu and inevitable impurities; an oxygen content of 100 ppm or lower; and an average grain size of 100 μm or less, and which exhibits the diffraction peaks assigned to the γ and ζ phases of CuGa as observed in X-ray diffraction, wherein the main peak intensity of the diffraction peaks assigned to the ζ phase is 10% or higher relative to that of the diffraction peaks assigned to the γ phase.

The definition of the γ and ζ phases can be found in the section for Cu—Ga-based alloys written by P. R. Subramanian and D. E. Laughlin from page. 1410 in "Binary Alloy Phase Diagrams ($2^{nd}$ Edition)" (Copyright 1990 by ASM International (R), ISBN: 0-87170-405-6), in which the chemical formulae and space groups of the respective phases are written as follows:
[Chemical Formula] γ phase: $Cu_9Ga_4$, ζ phase: $Cu_3Ga$
[Space Group] γ phase: P-43m, ζ phase: P63/mmcE Since this sputtering target has an oxygen content of 100 ppm or lower and an average grain size of 100 μm or less, that is, a low oxygen content and a small grain size, abnormal discharge can be significantly reduced.

In addition, since the significantly reduced oxygen content can suppress the increase of the oxygen content in the precursor film obtained by sputtering, the photoelectric conversion efficiency by the light-absorbing layer of a CIGS thin-film solar cell can be improved.

The reason why the Ga content is set to less than 30 at % is because most of the diffraction peaks assigned to the ζ phase disappear in the case where the Ga content is 30 at % or higher, and the peak intensity of the ζ phase relative to the γ phase becomes less than 10%, resulting in formation of a substantially single phase of the γ phase.

A method for producing a sputtering target according to a second aspect of the present invention is a method for producing the sputtering target according to the first aspect, the method comprising a step of sintering a green compact consisting or a mixture of a pure Cu powder and a Cu—Ga alloy powder under atmospheric pressure (i.e., pressureless sintering) by heating in a reducing atmosphere.

Specifically, since the green compact consisting of a mixture of a pure Cu powder and a Cu—Ga alloy powder is sintered under atmospheric pressure by heating in a reducing atmosphere, during which the γ and ζ phases appear due to the interdiffusion from each raw material powder, in this method for producing a sputtering target, a sintered compact can be obtained that exhibits the diffraction peaks assigned to the γ and ζ phases of CuGa as observed in X-ray diffraction and that has a very low oxygen content.

In addition, since the pure Cu powder, which readily undergoes plastic deformation, is used, the shape of the green compact thereof is easily maintained, while being formed. Further, since the pure Cu powder is oxidized even at room temperature but is easily reduced by heating in a reducing atmosphere, it does not cause an increase in its oxygen content. Furthermore, since the inclusion of a Cu—Ga alloy powder having 50 at % Ga causes liquid-phase sintering, a high density sintered compact can be obtained.

[Effects of the Invention]

According to the present invention, the following effects may be provided.

Specifically, since the sputtering target and the method for producing the same according to the present invention provide a sputtering target having an oxygen content of 100 ppm or lower, an average grain size of 100 μm or less, that is, a low oxygen content and a small grain size, and which exhibits the main peak intensity of the diffraction peaks assigned to the ζ phase of 10% or higher relative to that of the diffraction peaks assigned to the γ phase, abnormal discharges can be significantly reduced, and the increase of the oxygen content in the precursor film obtained by sputtering can also be suppressed.

Therefore, when the light-absorbing layer of a CIGS thin-film solar cell is deposited using the sputtering target and the sputtering method Of the present invention, the photoelectric conversion efficiency by the light-absorbing layer can be improved, and thus, a solar cell having a high power generation efficiency can be produced.

BRIEF DESCRIPTION OF THE DRAWINGS

FIG. 1 is a graph illustrating the diffraction peaks in X-ray diffraction of a sputtering target containing 25 at % Ga according to an Example regarding a sputtering target and a method for producing the same of the present invention.

FIG. 2 is a graph illustrating the-diffraction peaks in X-ray diffraction of a sputtering target containing 28 at % Ga according to an Example of the present invention.

FIG. 3 is a graph illustrating the diffraction peaks in X-ray diffraction of a sputtering target containing 29 at % Ga according to an Example of the present invention.

FIG. 4 is a graph illustrating the diffraction peaks in X-ray diffraction of a sputtering target containing 30 at % Ga according to a Comparative Example of the present invention.

FIG. 5 is a compositional image (COMPO image) by an electron probe microanalyser (EPMA) of a sputtering target containing 25 at % Ga according to an Example of the present invention.

FIG. 6 shows element distribution mapping images by EPMA of a sputtering target containing 25 at % Ga according to an Example of the present invention.

DESCRIPTION OF THE EMBODIMENTS

Hereafter, a sputtering target and a method for producing the same according to one embodiment of the present invention will be described.

The sputtering target of the present embodiment is composed of a sintered compact that has: a component composition containing a Ga content of 20 at % or higher and less than 30 at % wdth the balance being Cu and inevitable impurities; an oxygen content of 100 ppm or lower; and an average grain size of 100 μm or less, and that exhibits the diffraction peaks assigned to the γ phase ($Cu_9Ga_4$ phase) and the ζ phase ($Cu_3Ga$ phase) of CuGa as observed in X-ray diffraction, wherein the main peak intensity of the diffraction peaks assigned to the ζ phase is 10% or higher relative to that of the diffraction peaks assigned to the γ phase.

Furthermore, this sputtering target has a crystal structure in which a phase containing a relatively high Ga content (Ga-rich region) is dispersed. The Ga-rich region is the white portion seen in the COMPO image by EPMA in FIG. 5, for example.

Note that the main peak intensity of the diffraction peaks is the strongest peak among a plurality of diffraction peaks assigned to a specific metal phase.

The average grain size described above is calculated as follows: the sample surface obtained by cutting a target is polished into a mirror surface, etched with an etchant consisting of nitric acid and pure water, and then its photomicrograph is taken by an optical microscope at a magnification capable of identifying grain boundaries, i.e., in a range of 50× to 1000×; ten straight lines are drawn in the photograph so as to divide one side of the resultant photograph into eleven parts, and the number of crystal grains through which these ten lines pass is counted to derive the average grain size using the calculation formula below.

Average crystal grain size=(Corrected value of line segment length of ten lines in photograph into actual length)/(Number of crystal grains through which ten lines pass)

The oxygen content described above is determined by the infrared absorption method described in JIS Z 2613 "General Rules for Determination of Oxygen in Metallic Materials".

The method for producing a sputtering target of the present embodiment includes a step of sintering a green compact consisting of a mixture of a pure Cu powder and a Cu—Ga alloy powder under atmospheric pressure by heating in a reducing atmosphere.

Specifically, in one example of this method, firstly a pure Cu powder having an average grain size of 2 to 3 μm and a Cu—Ga alloy atomized powder having an average grain size of 20 to 30 μm are weighed to attain a target composition, and mixed for 1 minute at a rotational speed of 2800 rpm using Henschel mixer to prepare a mixed powder under an Ar atmosphere.

Next, the resultant mixed powder is formed into its pressurized powder body (green compact) at a compacting pressure or 500 to 2000 kgf/cm². This pressurized powder body is placed in a furnace, heated at a temperature of 10° C./min to a sintering temperature of 700 to 1000° C. with a reducing gas flowing at 10 to 100 L/min, and held, for five hours. Then, the furnace is allowed to cool, and the surface and periphery of the resultant sintered compact is machined by a lathe to produce a sputtering target having a diameter of 50 mm and a thickness of 6 mm. This Cu—Ga alloy atomized powder is prepared by an Ar gas atomization process using a carbon crucible filled with Cu and Ga raw materials at a specified composition ratio.

Next, the machined, sputtering target is bonded to a backing plate made of Cu, SUS (stainless steel), or the other metal (e.g., Mo) using In as a solder, and is subject to sputtering.

When the machined target is stored, the entire target is preferably vacuum-packed or packed in a package flushed with an inert gas in order to avoid its oxidation and moisture absorption.

The sputtering target thus produced is subject to direct current (DC) magnetron sputtering using Ar gas as a sputtering gas. In this DC sputtering, a pulsed DC power source including pulse voltage application may be used, or a DC power source without pulse may also be used.

Since the sputtering target of the present embodiment exhibits the main peak intensity of the diffraction peaks assigned to the $\zeta$ phase of 10% or higher relative to that of the diffraction peaks assigned to the $\gamma$ phase, and has an oxygen content of 100 ppm or lower and an average grain size of 100 μm or less, i.e., a low oxygen content and a small grain size, abnormal discharge can be significantly reduced.

Furthermore, since the significantly reduced oxygen content can suppress the increase of the oxygen content in the precursor film obtained by sputtering, the photoelectric conversion efficiency by the light-absorbing layer of a CIGS thin-film solar cell can be improved.

Since the green compact consisting of a mixture of a pure Cu powder and a Cu—Ga alloy powder is sintered under atmospheric pressure by heating in a reducing atmosphere, during which the $\gamma$ and $\zeta$ phases appear due to the interdiffusion from each raw material powder, in this method for producing a sputtering target, a sintered compact can be obtained that exhibits the diffraction peaks assigned to the $\gamma$ and $\zeta$ phases of CuGa as observed in X-ray diffraction and has a very low oxygen content.

The reason why the $\gamma$ and $\zeta$ phases coexist is because the appearance of a Ga-rich liquid phase from the Cu—Ga alloy powder during sintering causes what is called "liquid-phase sintering", in which the grains are readily rearranged. As a result, a high-density sintered compact can be obtained even by pressureless powder sintering, and this compact separates into the $\gamma$ and $\zeta$ phases at a temperature of around 620° C. during its cooling process. According to the Cu—Ga based phase diagram in "Binary Alloy Phase Diagrams ($2^{nd}$ Edition)" described above, this phase separation is expected to occur inevitably when the Ga atomic percent is less than 30%. The advantage of the two coexisting phases is in that the enlargement of crystal grains of the $\gamma$ phase can be suppressed by the existence of the $\zeta$ phase, which reduces the average grain size of the target structure, and thus abnormal discharges do not readily occur during sputtering.

EXAMPLES

Next, the evaluation results of the sputtering targets according to Examples produced based on the above embodiments regarding the sputtering target and the method for producing the same according to the present invention will be specifically described.

Firstly, a Cu—Ga alloy powder ("CuGa powder" in the table) having the component compositions and grain sizes shown in Table 1 and a Cu powder were combined in the amounts shown in Table 1 to prepare the mixed powders according to Examples 1 to 5. Next, the resultant mixed powders were formed into their pressurized powder bodies (green compacts) at a compacting pressure of 1500 kgf/cm². Further, the mixed powders according to Examples 1 to 3 were sintered under atmospheric pressure in a hydrogen atmosphere, the powder according to Example 4 was sintered under atmospheric pressure in a carbon monoxide atmosphere, and the powder according to Example 5 was sintered under atmospheric pressure in an ammonia cracking gas atmosphere. This pressureless sintering was performed at a sintering temperature of 840° C. held for five hours with a reducing gas flowing at 50 L/min.

For Comparison, Cu—Ga alloy powders ("CuGa powder" in the table) having the component compositions and grain sizes shown in Table 1 and a Cu powder were combined in the amounts shown in Table 1 to prepare the mixed powders according to Comparative Examples 1 to 4. The Ga contents of Comparative Examples 2 and 3 were set to be the values outside the range of the present invention. Next, the resultant mixed powders were formed into their pressurized powder bodies (compacts) as in the Examples described above. In Comparative Examples 5 and 8, only a Cu—Ga alloy powder was used as the raw material powder.

The powder according to Comparative Example 1 was sintered under atmospheric pressure in an air atmosphere, the powders according to Comparative Examples 2 3, and 8 were sintered under atmospheric pressure in a hydrogen atmosphere as in the Examples, and the powders according to Comparative Examples 4 and 5 were sintered in a vacuum by hot pressing. This hot pressing was conducted at a holding temperature of 740° C. and a holding time of 60 minutes.

In addition, the powders according to Comparative Examples 6 and 7 were prepared by a casting process so as to have the compositions shown in Table 1.

TABLE 1

| | FORMULATION BY MASS % | | Ga CONTENT IN CuGa POWDER | SINTERING METHOD | SINTERING ATMOSPHERE | COMPOSITION (at %) | | AVERAGE GRAIN SIZE | X-RAY DIFFRACTION | OXYGEN CONTENT | DENSITY | ABNORMAL DISCHARGE (NUMBER OF TIMES) |
|---|---|---|---|---|---|---|---|---|---|---|---|---|
| | Cu POWDER | CuGa POWDER | (at %) | | | Ga | Cu | (μm) | (ppm) | (g/cm³) | (g/cm³) | |
| EXAMPLE 1 | 57.8 | 42.2 | 50 | PRESSURELESS | HYDROGEN | 20.4 | BALANCE | 68 | $\gamma, \zeta$ | 75 | 8.8 | 1 |

TABLE 1-continued

| | FORMULATION BY MASS % | | Ga CONTENT IN CuGa POWDER (at %) | SINTERING METHOD | SINTERING ATMOSPHERE | COMPOSITION (at %) | | AVERAGE GRAIN SIZE (μm) | X-RAY DIFFRACTION | OXYGEN CONTENT (ppm) | DENSITY (g/cm³) | ABNORMAL DISCHARGE (NUMBER OF TIMES) |
|---|---|---|---|---|---|---|---|---|---|---|---|---|
| | Cu POWDER | CuGa POWDER | | | | Ga | Cu | | | | | |
| EXAMPLE 2 | 47.7 | 52.3 | 50 | PRESSURELESS | HYDROGEN | 24.6 | BALANCE | 75 | γ, ζ | 70 | 8.6 | 0 |
| EXAMPLE 3 | 38.8 | 61.2 | 50 | PRESSURELESS | HYDROGEN | 29.7 | BALANCE | 84 | γ, ζ | 55 | 8.4 | 0 |
| EXAMPLE 4 | 47.7 | 52.3 | 50 | PRESSURELESS | CARBON MONOXIDE | 24.7 | BALANCE | 74 | γ, ζ | 70 | 8.6 | 1 |
| EXAMPLE 5 | 47.7 | 52.3 | 50 | PRESSURELESS | AMMONIA CRACKING GAS | 25.6 | BALANCE | 79 | γ, ζ | 70 | 8.6 | 0 |
| COMPARATIVE EXAMPLE 1 | 47.7 | 52.3 | 50 | PRESSURELESS | AIR | 24.5 | BALANCE | <30 | γ, ζ | 300 | 6.9 | 13 |
| COMPARATIVE EXAMPLE 2 | 61.8 | 38.2 | 50 | PRESSURELESS | HYDROGEN | 18.2 | BALANCE | 55 | γ, ζ | 105 | 8.8 | 3 |
| COMPARATIVE EXAMPLE 3 | 37.8 | 62.2 | 50 | PRESSURELESS | HYDROGEN | 30.7 | BALANCE | 124 | γ | 55 | 8.4 | 7 |
| COMPARATIVE EXAMPLE 4 | 47.7 | 52.3 | 50 | HP | VACUUM | 25.8 | BALANCE | 51 | γ, ζ | 350 | 8.6 | 5 |
| COMPARATIVE EXAMPLE 5 | 0 | 100 | 30 | HP | VACUUM | 29.4 | BALANCE | 18 | γ, ζ | 370 | 8.4 | 8 |
| COMPARATIVE EXAMPLE 6 | — | — | — | CASTING | — | 30.2 | BALANCE | 900 | γ | 45 | 8.4 | 8 |
| COMPARATIVE EXAMPLE 7 | — | — | — | CASTING | — | 24.5 | BALANCE | 500 | γ, ζ | 50 | 8.6 | 6 |
| COMPARATIVE EXAMPLE 8 | 0 | 100 | 25 | PRESSURELESS | HYDROGEN | 25.6 | BALANCE | PRESSURIZED POWDER BODY NOT FORMED, AND THUS TARGET NOT PRODUCED | | | | |

The powders thus produced according to the Examples and Comparative Examples of the present invention were examined for the average grain size, the X-ray diffraction, the oxygen content, the density, and the number or abnormal discharges. The results are shown in Table 1. Note that since the powder according to Comparative Example 8 could not maintain its disc shape and was broken, the pressurized powder body and therefore the target thereof could not be formed. Hence, the measurement on this powder could not be performed. However, the part of the mass of the powder according to Comparative Example 8, which remained without being broken during the formation of the pressurized powder body, was sintered for measuring its Ga composition.

In addition, the compositions of the targets were determined by an ICP method (inductively coupled plasma method).

In the X-ray diffraction (XRD), the diffraction peaks assigned to the γ and ζ phases were observed. When the main peak intensity of the diffraction peaks assigned to the ζ phase is 10% or higher relative to that of the diffraction peaks assigned to the γ phase, the result was expressed as "γ, ζ" in Table 1, while when the main peak intensity of the diffraction peaks assigned to the ζ phase was less than 10% relative to that of the diffraction peaks assigned to the γ phase, the result was expressed as "γ" in Table 1.

in this XRD, the samples for targets were wet-ground with SiC-Paper (grit 180) and dried so as to obtain the measurement, samples. The device and measurement conditions used for this analysis are as follows:

Device: RINT-Ultima/PC available from Rigaku Corporation. (formerly named as "Rigaku Denki Co., Ltd.)"
Tube: Cu
Tube voltage: 40 kV
Tube current: 40 mA
Scan range (2θ): 20° to 120°
Slit size: Divergence slit (DS) of ⅔°, Scattering slit (SS) of ⅔°, Receiving slit (RS) of 0.8 mm
Measurement step width: 0.02° (2θ)
Scan speed: 2°/min
Sample stage rotation speed: 30 rpm The number of abnormal discharges was counted while sputtering the targets for 12 hours under the following deposition conditions:
Power source: Pulsed DC 500 W
Total pressure: 0.4 Pa
Sputtering gas: Ar (47.5 sccm), $O_2$ (2.5 sccm)
Distance between target and substrate (TS): 70 mm
The number of abnormal discharges was counted by the arc counting function of DC power source (model: RPDG-50A) available from MKS Instruments, Inc.

As can be seen from these results, in all the Examples of the present invention, the average grain size was as small as 68 to 84 μm, and the γ and ζ phases were observed in X-ray diffraction. Furthermore, in these Examples, the oxygen content was as low as 55 to 75 ppm, and the number of abnormal discharges was significantly reduced to one or none.

By contrast, in Comparative Example 1, in which the powder was sintered under atmospheric pressure in air, the oxygen content was as high as 300 ppm, and the number of abnormal discharges significantly increased to thirteen. In Comparative Example 2, in which a low Ga content was outside the composition range of the present invention, the oxygen content increased to 105 ppm, and the number of abnormal discharges increased to three. In Comparative Example 3, in which a high Ga content was outside the composition range of the present invention, a single γ phase was obtained, and the abnormal discharges increased to three.

In Comparative Examples 4 and 5, in which the powders were sintered by hot pressing, the oxygen contents in both Examples significantly increased to 300 ppm or higher, and the number of abnormal discharges also increased. In Comparative Examples 6 and 7, in which the powders were sintered by a casting process, the average grain sizes were 500 nm or larger, and the numbers of the abnormal discharges was increased to eight and six, respectively.

Next, the targets according to Examples of the present invention and a Comparative Example were produced so as to each have a Ga content of 25 at %, 28 at %, 29 at %, or 30 at % by pressureless sintering at a sintering temperature of 840° C. maintained for 5 hours with hydrogen gas flowing at 50 L/min, and their diffraction peaks were observed in XRD. The results are shown in FIGS. 1 to 4.

These results show that the γ and ζ phases were both clearly formed in the structure according to the Examples having a Ga content of 25 at %, 28 at %, or 29 at % because the diffraction peaks assigned to the γ phase ($Cu_9Ga_4$ phase) and the ζ phase ($Cu_3Ga$ phase) were observed, wherein the main peak intensity of the diffraction peaks assigned to the ζ phase was 10% or higher relative to that of the diffraction peaks assigned to the γ phase. However, it can be seen that when the Ga content was 30 at %, most of the diffraction peaks assigned to the ζ phase disappeared, that is, the structure had only a substantially single γ phase.

Next, a target according to an Example of the present invention was produced so as to have a Ga content of 25 at % by pressureless sintering at a sintering temperature of 840° C. maintained for 5 hours with hydrogen gas flowing at 50 L/min, and its structure was observed by EPMA. The compositional image (COMPO image) and elemental mapping images of Cu, Ga, O (oxygen), and C (carbon) are shown in FIGS. 5 and 6. These EPMA elemental mapping images are all originally colored, but are converted to the black-and-white images by gray scaling. In the Cu mapping image, the portion that is very light tends to have a high Gu content. In the Ga mapping image, the portion that is darker tends to have a high Ga content. In the COMPO Image, the whitest portion shows the region having a relatively high Ga content.

As can be seen from these images, the target according to the Example of the present invention has a crystal structure in which the phase containing a relatively high Ga content (Ga-rich region) is dispersed.

In order to utilize the present invention as a sputtering target, it preferably has a surface roughness of 1.5 μm or less, an electrical resistance of $1 \times 10^{-4}$ Ω·cm or less, a metallic impurity concentration of 0.1 at % or less, and a transverse rupture strength of 150 MPa or higher. All the targets according to the Examples described above meet these conditions.

Note that the technical scope of the present invention is not limited to the aforementioned embodiments and Examples, but the present invention may be modified in various ways without departing from the scope or teaching of the present invention.

For example, although the sputtering targets according to the embodiments and Examples described above have planar shapes, a cylindrical sputtering target may also be used.

What is claimed is:

1. A sputtering target composed of a sintered compact that has:
   a component composition containing a Ga content of 20 at % or higher and less than 30 at % with the balance being Cu and inevitable impurities;
   an oxygen content of 100 ppm or lower; and
   an average grain size of 100 μm or less,
   and which exhibits the diffraction peaks assigned to the γ and ζ phases of CuGa as observed in X-ray diffraction, wherein the main peak intensity of the diffraction peaks assigned to the ζ phase is 10% or higher relative to that of the diffraction peaks assigned to the γ phase.

2. A method for producing the sputtering target according to claim 1, the method comprising a step of sintering a green compact consisting of a mixture of a pure Cu powder and a Cu—Ga alloy powder under atmospheric pressure by heating in a reducing atmosphere.

* * * * *